United States Patent
Schaumont et al.

(10) Patent No.: US 7,113,901 B1
(45) Date of Patent: Sep. 26, 2006

(54) REUSE OF HARDWARE COMPONENTS

(75) Inventors: Patrick Schaumont, Wijgmaal (BE); Radim Cmar, Prievidza (SK); Serge Vernalde, Heverlee (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/273,089

(22) Filed: Mar. 19, 1999

Related U.S. Application Data

(63) Continuation-in-part of application No. 09/237,549, filed on Jan. 26, 1999, now Pat. No. 6,606,588, which is a continuation-in-part of application No. 09/041,985, filed on Mar. 13, 1998, now Pat. No. 6,233,540.

(60) Provisional application No. 60/041,121, filed on Mar. 20, 1997, provisional application No. 60/039,078, filed on Mar. 14, 1997, and provisional application No. 60/039,079, filed on Mar. 14, 1997.

(51) Int. Cl.
    *G06F 17/50* (2006.01)

(52) U.S. Cl. ............... 703/14; 703/2; 703/15; 717/108

(58) Field of Classification Search .................. 703/14, 703/15, 16; 716/4, 5, 6; 707/103; 345/964; 717/9, 106, 107, 108
See application file for complete search history.

(56) References Cited

U.S. PATENT DOCUMENTS

| | | | | |
|---|---|---|---|---|
| 5,493,508 A | * | 2/1996 | Dangelo et al. ............... 716/5 |
| 5,544,067 A | * | 8/1996 | Rostoker et al. .............. 703/14 |
| 5,623,418 A | | 4/1997 | Rosotker et al. .............. 716/1 |
| 5,726,902 A | * | 3/1998 | Mahmood et al. ............. 716/6 |
| 5,870,585 A | * | 2/1999 | Stapleton ..................... 703/15 |
| 5,923,867 A | * | 7/1999 | Hand ........................... 703/14 |
| 5,933,356 A | | 8/1999 | Rostoker et al. .............. 703/15 |
| 6,064,819 A | * | 5/2000 | Franssen et al. ............. 717/156 |
| 6,233,540 B1 | * | 5/2001 | Schaumont et al. .......... 703/14 |
| 6,324,678 B1 | | 11/2001 | Damgelo et al. ............. 716/18 |
| 6,606,588 B1 | * | 8/2003 | Schaumont et al. .......... 703/15 |

FOREIGN PATENT DOCUMENTS

EP    0 772 140 A1    7/1997

OTHER PUBLICATIONS

Yeh et al., G.K. Operas in a DSP CAD Environment, Proceedings of the European Design Automation Conference, ACM, Sep. 1994, pp. 130–135.*

Tanurhan et al., Y. An Approach for Integrated Specification and Design of Real–Time Systems, Proceedings of the EURO–VHDL '96 and European Design Automation, Sep. 1996, pp. 258–263.*

Poechmueller et al., P. A CAD Tool for Designing Large, Fault–Tolerant VLSI Arrays, Proceedings of the First Great Lakes Symposium on VLSI, 1991, pp. 132–137.*

Altmeyer, et al. "Generating ECAD Framework Code from Abstract Models," Proc. of the 32nd ACM/IEEE Conf. on Design Automation, 1995, pp. 88–93.

(Continued)

*Primary Examiner*—Russell Frejd
(74) *Attorney, Agent, or Firm*—Knobbe Martens Olson & Bear LLP

(57) ABSTRACT

A method for designing an electronic system having at least one digital part. The method includes representing a behavioral description of the system as a first set of objects with a first set of relations therebetween. Furthermore, the method includes refining said behavioral description into an implementable description of said system, said implementable description being represented as a second set of objects with a second set of relations therebetween. Also, the method includes retaining at least one of said second objects for reuse in the design of a second electronic system.

31 Claims, 8 Drawing Sheets

OTHER PUBLICATIONS

Basu, et al. "DOORS: An Object–Oriented CAD System for High Level Synthesis," IEE Proceedings—Computers and Digital Techniques, 1997, vol. 144 Issue 5, pp. 331–342.

Bill Lin. "System Design Tools for Broadband Telecom Network Applications" XP–002114729, 1996, pp. 23–26.

Bolsens, et al. "Hardware/Software Co–Design of Digital Telecommunications Systems," Proceedings of the IEEE, 1997, vol. 85, Issue 3, pp. 391–418.

Bredenfeld et al. "Tool Integration and Construction using General Graph–based Design Representations," Proc. of the 32nd ACM/IEEE Conf. on Design Automation, 1995.

Burr, et al. "OPERAS in a DSP CAD Environment," Proceedings of the European Design Automation Conference, 1994, pp. 130–135.

Chao, et al. "Efficient Retiming and Unfolding," IEEE Inter. Conf. on Acoustics, Speech and Signal Processing, 1993, vol. 1, pp. 421–424.

De Micheli, et al. "The Olympus Synthesis System," IEEE Design & Test of Computers, 1990, vol. 7, Issue 5, pp. 37–53.

Hylander and Meador. "Object Oriented VLSI Design Automation for Pulse Coded Neural Networks," 1994 IEEE International conference on Neural Networks, 1994, vol. 3, pp. 1825–1829.

Lanneer, et al. "An Object–Oriented Framework Supporting the full High–Level Synthesis Trajectory" Computer Hardware Description Languages and their Applications, XP–002114731, 1991, pp. 301–320.

Lavenier and McConnell. "From Behavioral to RTL Models: An Approach," Proceedings of the Fifth International Workshop on Rapid System Prototyping, 1994, pp. 153–161.

Moon, et al. "An Object–Oriented VHDL Design Environment," Proc. of the 27th ACM/IEEE Design Automation Conf., 1990, pp. 431–436.

Nagasmay, et al. "Specification, Planning and Synthesis in a VHDL Design Environment," IEEE Design & Test of Computers, 1992, vol. 9, Issue 2, pp. 58–68.

Pangrle, et al. "An Integrated Multi–level Synthesis System," First International Workshop on Rapid System Prototyping, 1990, pp. 167–175.

Sarkar, et al. "Synchronization of Communicating Modules and Processes in High Level Synthesis," Proceedings of the 8th International Conference on VLSI Design, 1995, pp. 87–92.

Schaumont, et al. "Synthesis of Multi–rate and Variable Rate Circuits for High Speed Telecommunications Applications" XP–002114732, 1997, pp. 542–546.

Stoel, et al. "VIOOL for Hardware/Software Codesign," Proc. 1995 Inter. Symp. on Sys. Eng. of Computer Bases Systems, 1995, pp. 333–340.

Van Rompaey, et al. "CoWare—A Design Environment for Heterogeneous Hardware/Software Systems," Proc. EURO–DAC 1996, pp. 252–257.

Vemuri, et al. "An Integrated Multicomponent Synthesis Environment for MCMs," Computer, 1993, vol. 26, Issue 4, pp. 62–74.

Verkest, et al. "Co–Ware—A Design Environment for Heterogeneous Hardware/Software Systems" Design Automation for Embedded Systems, XP–022114730, 1996, pp. 357–386.

Woo, et al. "Codesign from Cospecification" Computing Practices, XP–002114728, 1994, pp. 42–47.

Yang, et al. L.; Perkowski, M.A.; Smith, D.; "Object–Oriented Design of an Expandable Hardware Description Language Analyzer for a High Level Synthesis System," Proceedings of the Twenty–fifth Hawaii International Conference on System Sciences, 1992, vol. 2. pp.

York, et al. "An Integrated Environment for HDL Verification," Proceedings of the IEEE International Verilog HDL Conference, 1995, pp. 9–18.

John Forest *Implementation–Independent Descriptions Using an Object–Oriented Approach*", In "Co Design—Computer–Aided Software/Hardware Engineering", IEEE Press Marketing, 1995, pp. 263–278.

Swamy, Somitri, et al.; OO–VHDL. Object–oriented extensions to VHDL; *Computer*, vol. 28 (No. 10): pp. 18–26; Oct. 1995.

Gupta, Rajesh K., et al.; Using a Programming Language for Digital System Design; *IEEE Design& Test Of Computers*; pp. 72–80; Apr.–Jun. 1997.

* cited by examiner

REUSE OF HARDWARE COMPONENTS

RELATED APPLICATION

The present application is a continuation-in-part of U.S. patent application No. 09/237,549 filed on Jan. 26, 1999, now U.S. Pat. No. 6,606,588, which is hereby incorporated by reference which is a continuation-in-part of U.S. patent application Ser. No. 09/041,985, filed Mar. 13, 1998, now U.S. Pat. No. 6,233,540, which in turn claims priority to the following provisional applications: U.S. Provisional Application No. 60/039,078, filed Mar. 14, 1997, U.S. Provisional Application No. 60/039,079, filed Mar. 14, 1997, and U.S. Provisional Application No. 60/041,121, filed Mar. 20, 1997. Furthermore, the present application claims priority to European Patent Application No. 98870205.6, filed Sep. 24, 1998.

BACKGROUND OF THE INVENTION

1. Field of the Invention

This invention relates to a method for reusing electronic hardware component designs as a part of other designs.

2. Description of the Related Technology

A design methodology and a design environment for a hardware/software system co-design environment has been disclosed previously in EP-A-772140 describing a hardware/software co-design environment and design methodology based on a data-model that allows to specify, simulate, and synthesize heterogeneous hardware/software architectures from a heterogeneous specification. Said environment and said methodology are based on the principle of encapsulation of existing hardware and software compilers and allow for the interactive synthesis of hardware/software and hardware/hardware interfaces. Said database is compiled on a memory structure adapted for access by executable programs on a computer for generating the implementation of said heterogeneous essentially digital system, comprising a plurality of objects representing aspects of said digital system wherein said objects comprise primitive objects representing the specification of said digital system and hierarchical objects being created by said executable programs while generating the implementation of said digital system, said hierarchical objects being refinements of said primitive objects and having more detail and preserving any one or all of said aspects to thereby generate said implementation of said digital system; and further comprising relations inbetween said primitive objects and inbetween said hierarchical objects and between said primitive objects and said hierarchical objects; and further comprising functions for manipulating said objects and said relations. This type of design environment and method, disclosed in EP-A-772140, uses objects that represent aspects of the digital system. This type of design environment needs functions for manipulating the objects, in order to achieve an implementation of the digital system. These functions and the executable programs compiled on a computer refine the primitive objects and give rise to the implementation. The present patent application as well as EP-A-867820 on the other hand disclose another type of design environment and design methodology. EP-A-867820 is incorporated herein by reference. The present patent application discloses a design environment and design methodology that faces another problem, as summarised herebelow.

The rush forward of digital implementation technology faces contemporary chip designers with ever increasing design complexities. This makes the ability to reuse components in a system an essential design skill. Examples of such components are embedded cores, or complex random logic blocks. The established view on reuse is focused at the structural level. A component is made reusable by matching it to a standard interface. This interface defines input/output signals, their timing relationship etc. Such an interface allows to hide the detailed design of a component as intellectual property (IP) of a designer, and yet makes the component available for reuse. The reuse of hardware components at the structural level is not without problems. Several reasons are mentioned for this:

Reuse is in the first place a matter of reusing functionality, not structure. It happens often that a component can be 'almost' reused, but requires additional encapsulation to match the right behavior. For instance, a digital filter can have the ideal characteristic and performance for a modem system, but contains a serial coefficient programming input instead of the required parallel one.

Structural reuse seals the behavior of a component in a closed box behind the reuse interface. As a result, the reused behavior can only be manipulated indirectly through this interface. Introducing for instance a wait state in the operation of a memory controller might require cumbersome interface manipulations.

Current hardware development environments are good in capturing, simulation and synthesis of hardware components. They do however a bad job in manipulating the same descriptions. As an example, VHDL defines a component as an entity with a well defined port set. It is not possible to strip the ports of an entity depending on some external design condition.

As shown in table 1, the difficulties of reusing structure can be substantial. The table shows some statistics for a DECT transceiver. It lists the total number of blocks, and the amount of blocks that have a programming interface function (prog). The RT-VHDL line count is shown, first without this programming function (wo/prog) and next including it (w/prog). It clearly shows the extra RT coding required by one extra per-block function.

TABLE 1

| RT counts for DECT design | | | |
|---|---|---|---|
| Block count | | RT-VHDL line count | |
| Total | prog | wo/prog | w/prog |
| DECT 25 | 23 | 17K | 28K |

This situation has been recognized by other authors as a 'Silicon Ceiling' (G. Martin. Design methodologies for system level ip. In Proc. DATE 1998, pages 286–302). Research solutions have been either to encapsulate VHDL within an advanced design environment (G. Lehmann, B. Wunder, and K. Muller-Glaser. A vhdl reuse workbench. In Proc. EDAC 1996, pages 412–417) or else to extend the semantics of VHDL itself (P. Ashenden, P. Wilsey, and D. Martin. Reuse through genericity in suave. In Proc. VIUF 1997 Fall Conf., pages 170–177 and B. Djafri and J. Benzakki. Oovhdl: Object oriented vhdl. In Proc. VIUF 1997 Fall Conf., pages 54–59).

Aims of the Invention

A primary aim of the present invention is to provide a method for reusing complete electronic hardware component designs in other hardware designs.

A further aim of the present invention is to provide a method enabling reuse the function of an electronic hardware component in another design.

Another aim of the present invention is to provide a method enabling reuse of at least a part of the functionality of an electronic hardware component design.

SUMMARY OF THE INVENTION

The present invention concerns a method for designing an electronic system comprising at least one digital part, comprising the steps of
- representing a behavioral description of said system as a first set of objects with a first set of relations therebetween;
- refining said behavioral description into an implementable description of said system, said implementable description being represented as a second set of objects with a second set of relations therebetween; and
- retaining at least one of said second objects for reuse in the design of a second electronic system.

Preferably, said step of retaining comprises the substeps of
- selecting out of said second set of objects a subset of second objects having substantially the same functionality and/or characteristics in said implementable description;
- creating a class representing said same functionality and/or characteristics; and
- storing said class in a library.

Said class can comprise methods (functions of an object). These functions are part of the objects in contrast to the functions disclosed in detail in EP-A-772140. The functions recited in EP-A-772140 are external to the objects recited in EP-A-772140.

The second electronic system preferably comprises objects that are instances of said class.

Said second set of objects preferably have a common semantics.

Preferably, said class executes a parametric manipulation on said second set of objects. Advantageously, said parametric manipulation is a parametric expansion.

Expansion of existing objects can include the addition to an object of methods (functions of an object) that create new objects. Said object is said to be expanded with the new objects. The use of expandable objects allows to use metacode generation: creating expandable objects implies an indirect creation of the new objects.

Preferably, said class is a reusable component. In a first preferred embodiment of the present invention, the method can further comprise the steps of:
- describing the electronic system by formal means in a formal description, said formal description being the representation of said behavioral description of said system as said second set of objects with said second set of relations therebetween;
- selecting a functional entity within said system, said functional entity corresponding to said subset of second objects having substantially the same functionality and/or characteristics in said implementable description;
- formulating said functional entity as a reusable entity by formulating said functional entity as a parametric expansion of said formal description;
- describing said reusable entity as said reusable component using said formal description such that said reusable entity is a parametric expansion of said reusable component.

Said formal description is preferably formulated in an object-oriented programming language, and said parametric expansion is preferably performed on an object hierarchy.

In a second preferred embodiment, the method further comprising the steps of designing another electronic system comprising at least one digital part and wherein said class is used for creating objects within the design of the other electronic system. The method can further comprise the steps of:
- selecting the behavioral register-transfer level design description of a first hardware component within the design of said electronic system, said hardware component having at least a part of the desired functionality of a target hardware component that is comprised in the design of said other electronic system;
- determining the changes that are necessary to reuse said hardware component in the design of said other electronic system; and
- formulating the changes that are necessary to reuse said hardware component in a class that is able to transform the implementable description of said hardware component into said target hardware component.

Said changes can comprise a parametric expansion performed on an object hierarchy. Preferably, said object hierarchy is expressed using an object-oriented programming language, advantageously C++.

Said behavioral description is preferably described as a hierarchy of one or more objects selected from the group consisting of:
- finite state objects,
- state objects enumerating the states of said finite state objects,
- transition objects that relate said state objects,
- instruction objects that represent processing done when said transition objects are executed, and
- operation objects that make up parts of said instruction objects.

The changes are preferably selected from the group consisting of:
- adding extra state objects and/or transition objects to a finite state machine,
- adding extra operations to an instruction objects,
- merging two or more behavioral descriptions,
- removing an object from said hierarchy,
- modifying an object from said hierarchy, and
- any combination of the above.

The behavioral register-transfer level design of the first hardware component is preferably expressed using an object-oriented programming language, said object-oriented programming language advantageously being C++.

The method according to this second preffered embodiment can further comprise a refining step, said refining step comprising formulating structural characteristics of a hardware component as an object hierarchy of one or more objects selected from the group consisting of:
- finite state objects,
- state objects enumerating the states of said finite state objects,
- transition objects that relate said state objects,
- instruction objects that represent processing done when said transition objects are executed, and
- operation objects that make up parts of said instruction objects.

Said refining step can comprise the addition of new objects, permitting interaction with existing objects, and adjustments to said existing objects allowing said interaction.

Preferably, said refining step is performed in an extendible environment and comprises expansion of existing objects.

The present invention further concerns a method for the reuse of a first hardware component in a hardware design, characterised by the following steps:

- selecting the behavioral register-transfer level design description of a first hardware component with at least a part of the desired functionality of a target hardware component that is comprised in said hardware design,
- if necessary, transform said design description to an object hierarchy,
- determine the changes that are necessary to reuse said hardware component in said hardware design, and
- create an object that comprises an expand( ) method capable of transforming said object hierarchy into a second object hierarchy that describes said target hardware component.

The first hardware component can thus be transformed in the desired target hardware component by invoking the expand( ) method. The arguments of expand( ) are called hooks and are elements of the behavioral register-transfer level design description of said first hardware component.

The method according to the present invention can be further characterised in that said object hierarchy is expressed using an object-oriented programming language, said object-oriented programming language preferably being C++.

The changes can be chosen from the group consisting of:
- adding extra states or transitions to a finite state machine,
- adding extra operations to an instruction to provide extra functionality,
- merging two or more descriptions,
- modifying states, transitions, signals and/or instructions, and/or
- any combination of the above.

Preferably, the behavioral register-transfer level design of the first hardware component is expressed using an object-oriented programming language, said object-oriented programming language advantageously being C++.

The invention further relates to a method for the reuse of a part of a hardware design, characterised by the following steps:

- describing said hardware design by formal means in a formal description,
- selecting said part of said hardware design,
- formulating said part as a reusable part by formulating said part as a parametric expansion of said formal description, and
- describing a reusable prototype of said reusable part using said formal description such that said reusable part is a parametric expansion of said reusable prototype.

Preferably, said formal description is an object-oriented programming language, advantageously C++, said reusable prototype is an object and said parametric expansion is an expand( ) method.

The word object in this patent application has the meaning of an object as used in Object-Oriented programming languages (OOPL), such as C++. An object usually comprises methods, which are functions that can be performed with or on that object. The objects as described in this patent application show all the features of objects from an OOPL, said features being well known to persons skilled in the art. A reference to the principles of Object-Oriented programming can be found in "Object Oriented Design" (G. Booch, Benjamin/Cummings Publishing, Redwood City, Calif., 1991).

An object, as referred to throughout this patent application, has a state, behavior and identity. The structure and behavior of similar objects are defined in their common class. The terms object and instance are interchangeable.

A class is a specification of structure (instance variables), behavior (methods) and inheritance (parents, or recursive structure and behavior) for objects. A class is a set of objects that share a common structure and a common behavior. A single object is an instance of a class.

A method implements behavior, and is a function or procedure which is defined in a class and can typically access the internal state of an object of that class to perform some operation.

SHORT DESCRIPTION OF THE FIGURES

FIG. 1 describes two communicating processors that need an interblock synchronization interface.

FIG. 2 describes a programming interface for a data processing unit of an ASIC.

Figure 1:
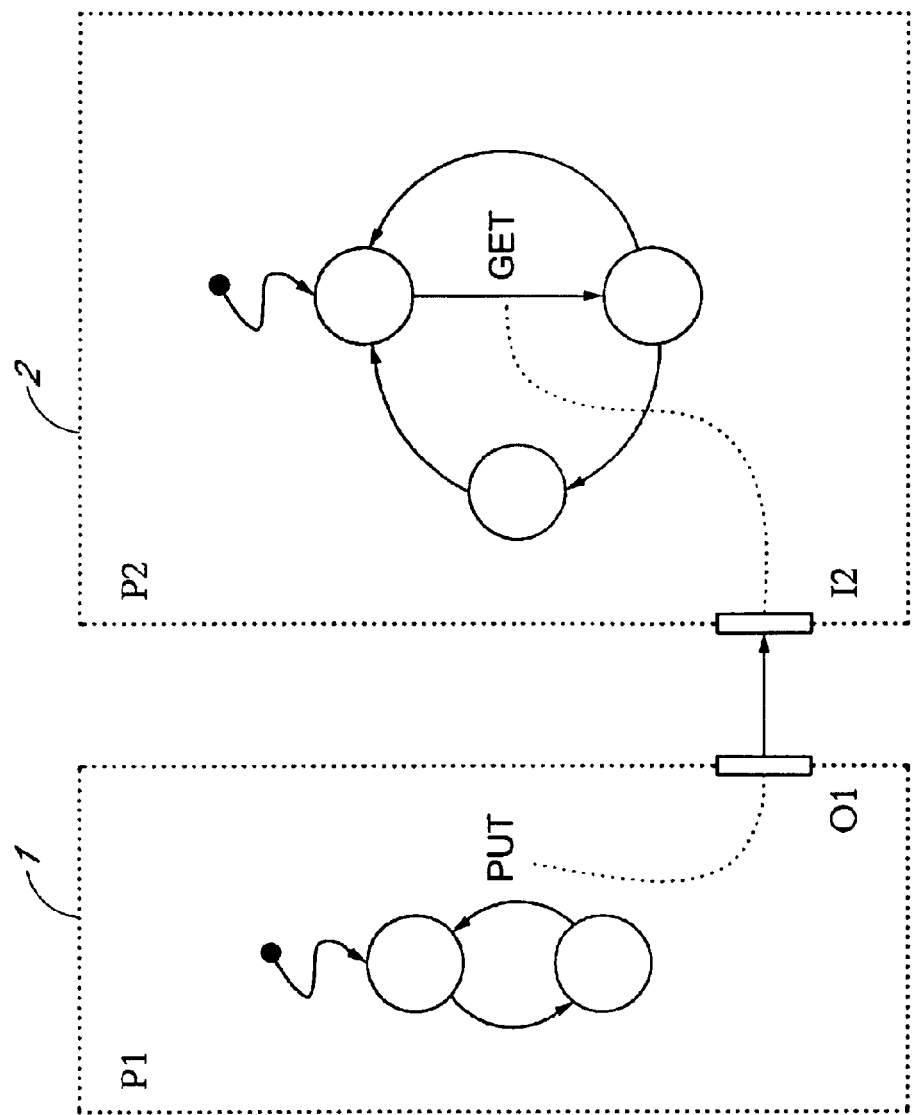
Figure 5:
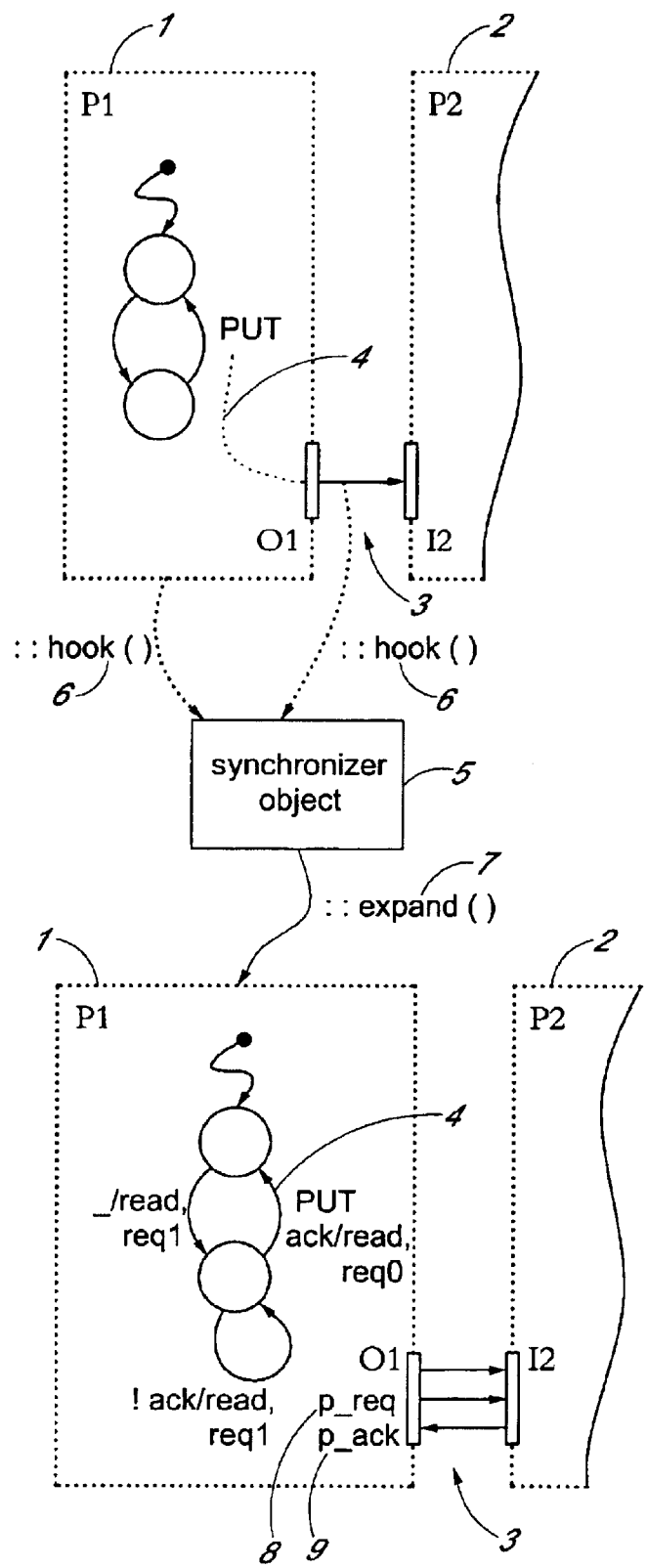

FIG. 5 describes the two communicating processors of FIG. 1, expanded according to the present invention with the synchronizer object.

Figure 2:
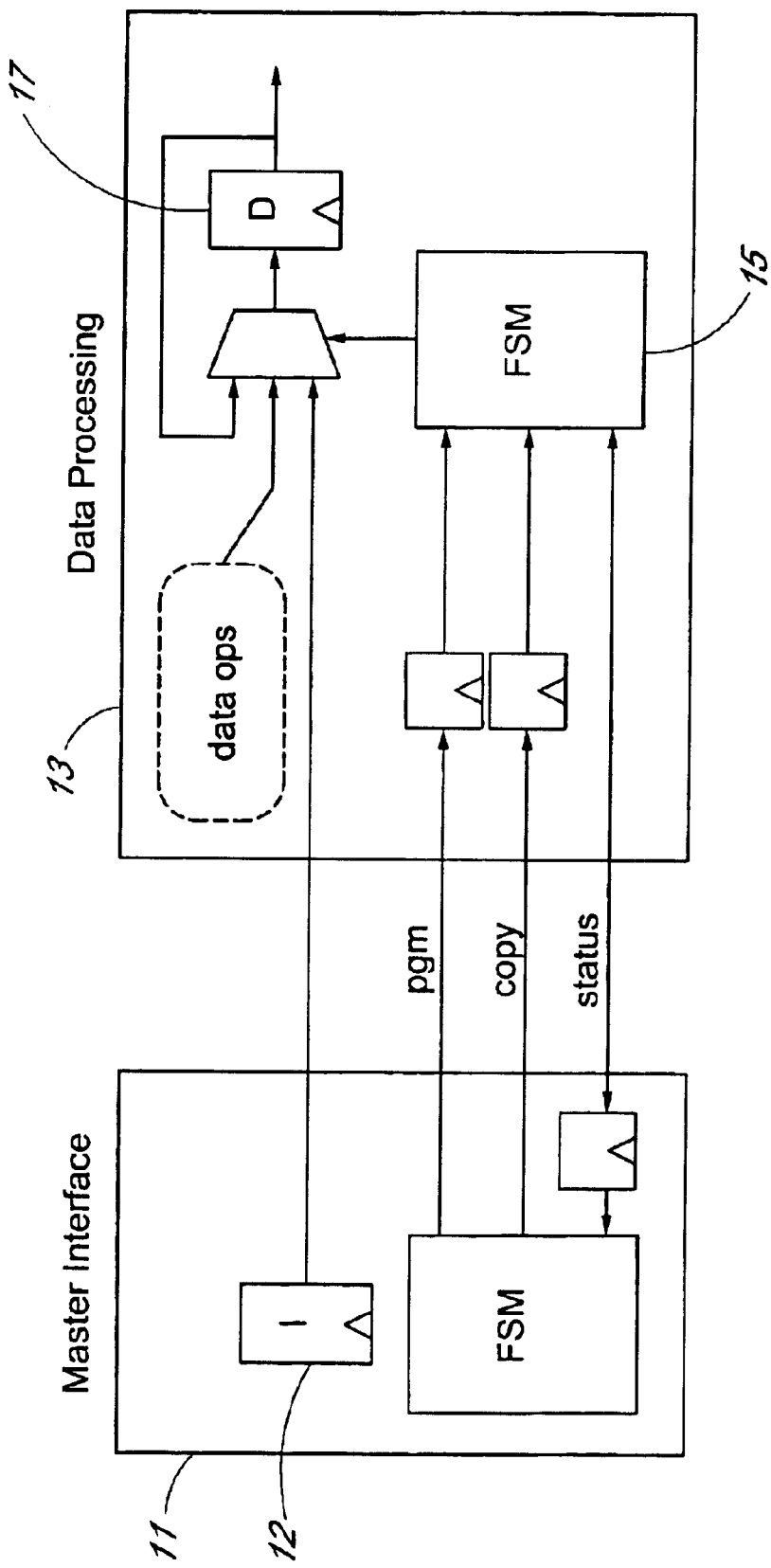
Figure 6:
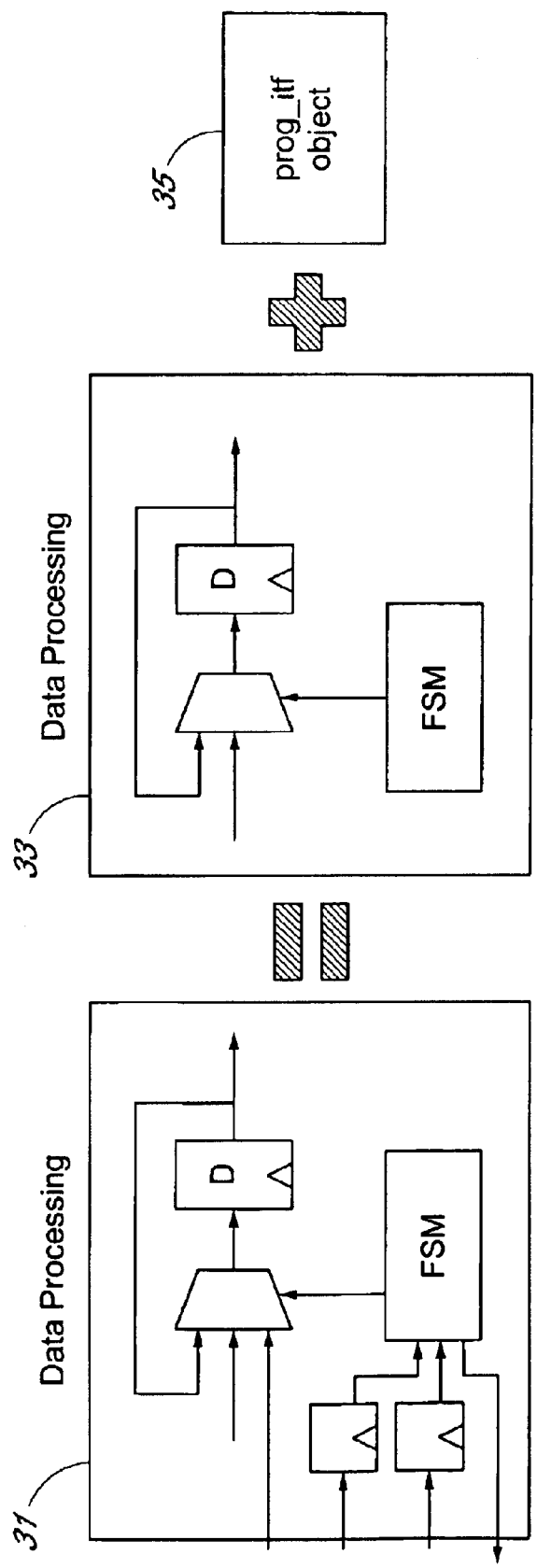

FIG. 6 depicts the programming interface of FIG. 2 as a behavioral reuse object according to the present invention.

Figure 4:
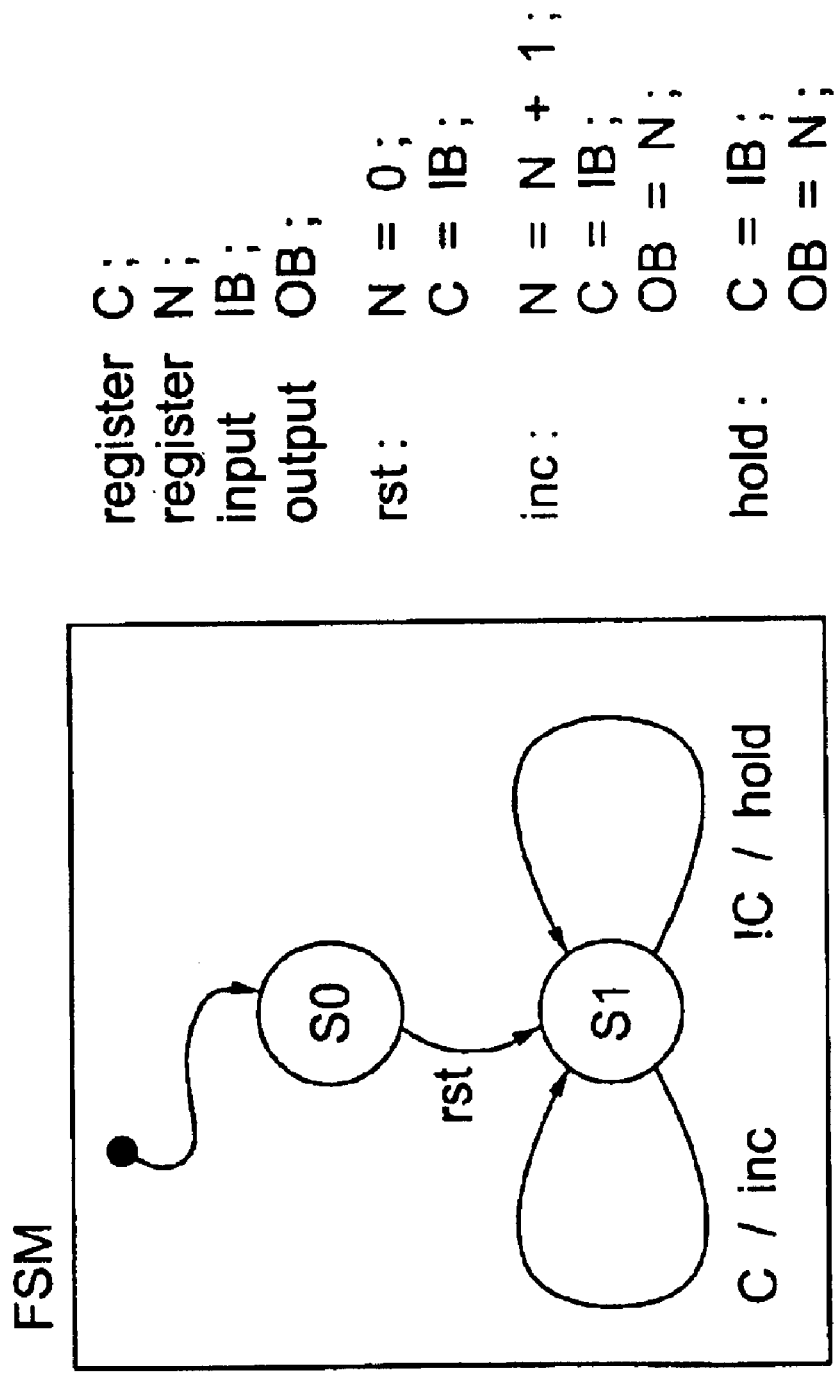
FIG. 4 depicts the same ones counter in a behavioral RT description.
Figure 7:
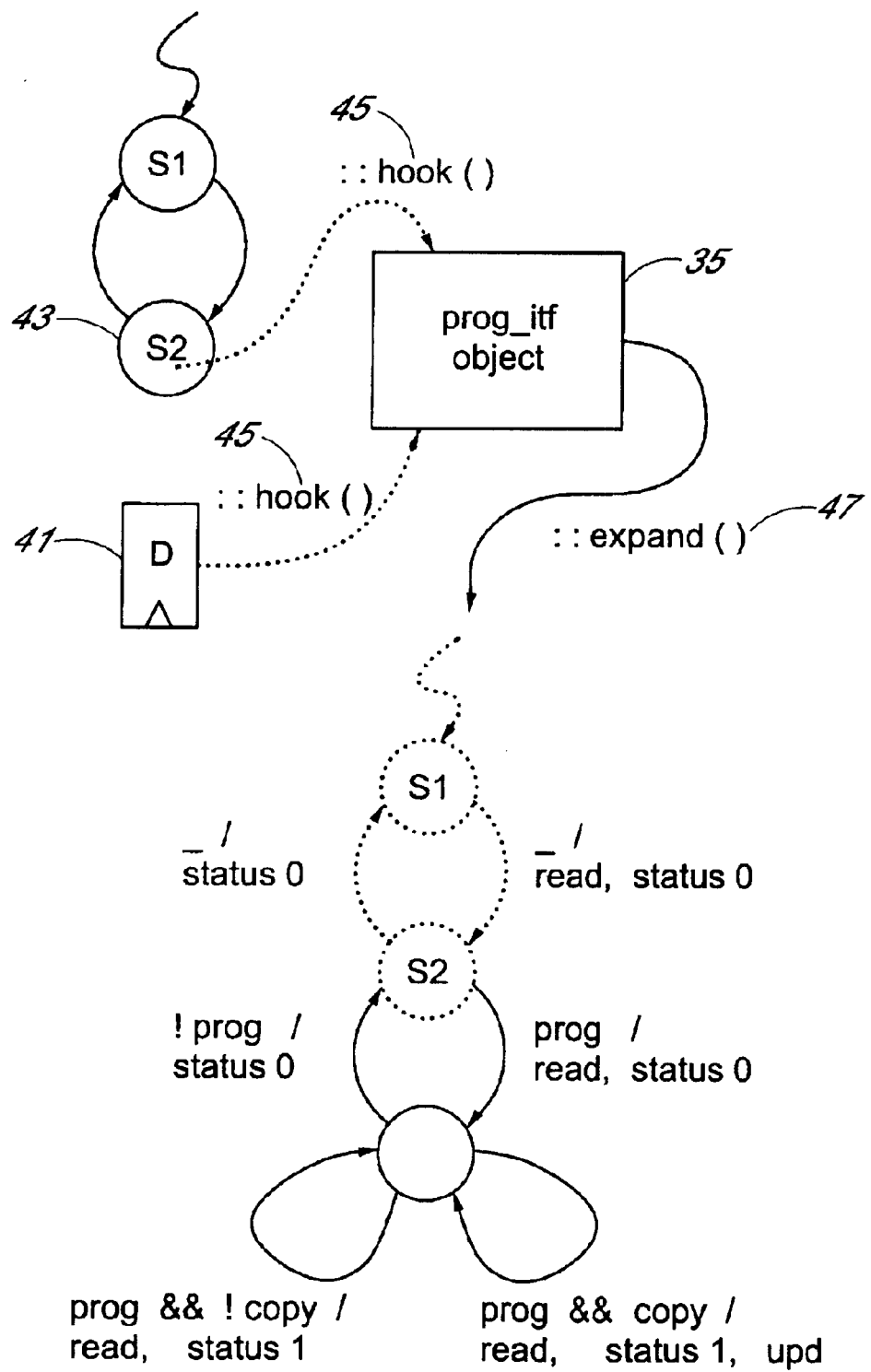

FIG. 7 shows the ones-counter behavioral RT as in FIG. 4, expanded according to the present invention with the prog_itf object.

Figure 8:
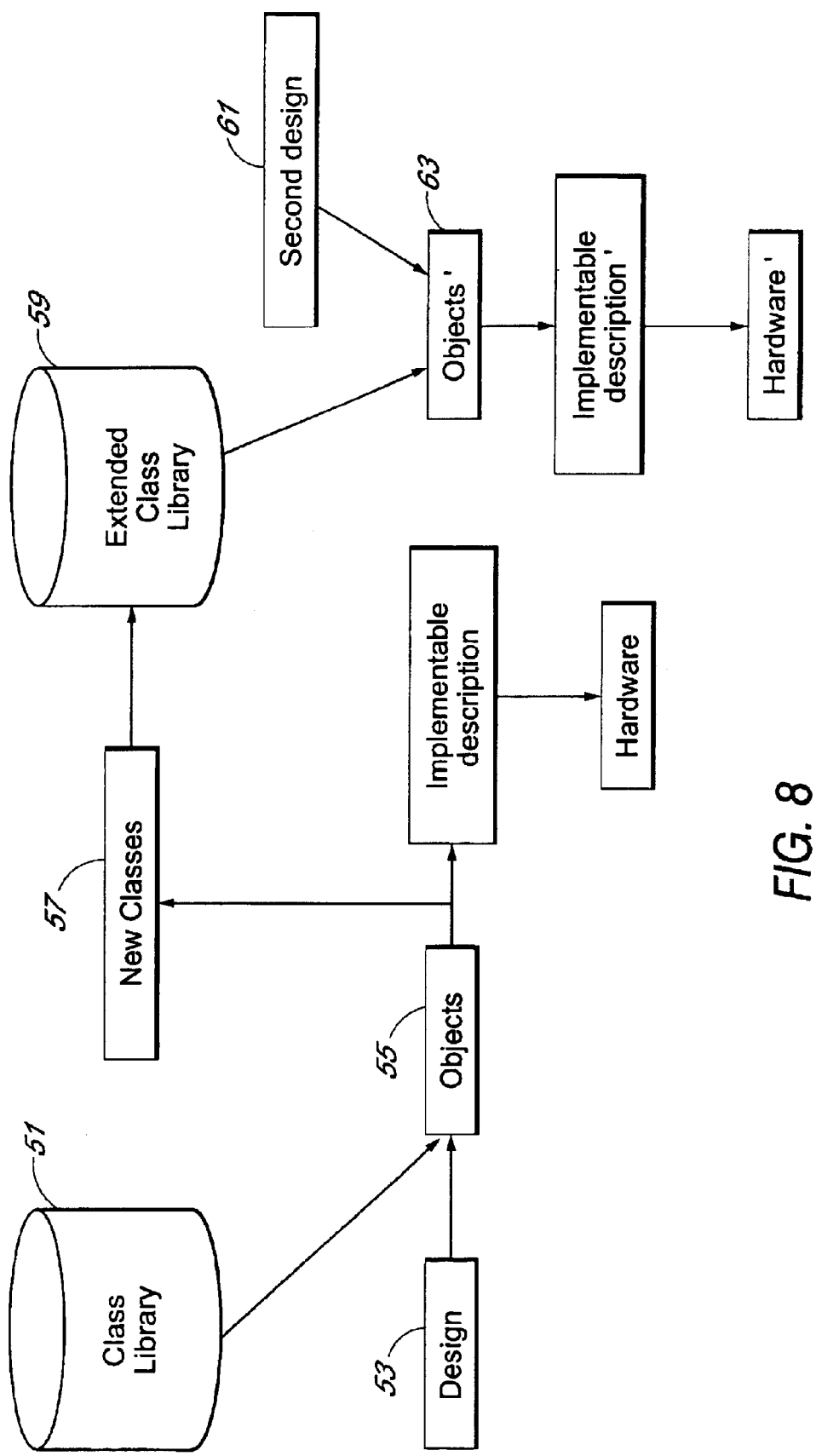

FIG. 8 describes schematically the present invention.

DETAILED DESCRIPTION OF THE INVENTION

Being faced with structural reuse problems in several recent demonstrator designs, the inventors developed a hardware reuse mechanism at the more abstract behavioral RT-level.

The invention concerns a method for behavioral reuse. The advantage over current, structural reuse, is that the reuse interface is defined at a much higher level. In the present invention, the reuse interface is defined at the behavioral RT level. The RT descriptions are entered in an object oriented environment. The following are essential advantages of this reuse method:

- Dislike functions in the same component can be developed independently.
- Reusing functions instead of structure enables compact descriptions that are more easy to understand and maintain.
- Distribution of the reusable objects can be done as object code. Therefore, intellectual property of a reused function is safeguarded.

The present invention will be further clarified using non-limiting examples and figures.

Problem 1: Interblock Synchronization According to the State of the Art

FIG. 1 shows a simple case of communicating processors. Each of the processor's behavior is described through a finite state machine (FSM). The nodes indicate an execution state, while the transitions between states correspond to one clock cycle of data processing. Each of the FSM thus represents the schedule of an algorithm. The GET and PUT operations show at which clock cycles the processors communicate data. This shows that there is an input/output dependency between processors P1 (1) and P2 (2). When unsynchronized, processor P1 (1) produces output data every second clock cycle. This data is consumed by processor P2 (2) with a variable schedule of two or three clock cycles. The communication of data thus introduces a synchronization requirement between P1 and P2 to guarantee correct operation of the system. The current practice to solve this kind of communication consistency problem is to use one of the following methods.

a) To adapt each of the processor's description such that they are always in perfect synchrony.
 b) To introduce a global synchronization mechanism that forces communication synchrony.
 c) To embed a fixed communication protocol onto the IO ports.

When thinking in terms of reuse, neither of these three solutions is optimal. This is because the communication scheme can change in the next application, which necessitates a change to the processor description. Cases a) and b) force designers to solve two interdependent tasks at the same time (local and global behavior), resulting in a difficult and hard-coded solution. Case c) implies the use of a universal communication mechanism which might not be needed in the next application.

Structural reuse becomes hard, or in the best case causes an overhead in silicon and/or timing.

Problem 2: A Programming Interface According to the State of the Art:

The second example, a programming interface, is a common feature in ASICs. An example is shown in FIG. 2. It consists of two blocks out of a synchronous ASIC design. Only the parts relevant to the programming interface are shown. The first is a Master Interface (11). The purpose of this block is to make the data processing registers of the ASIC programmable from the outside world. The second block, Data Processing (13), is a functional component of the ASIC. This block has a local controller FSM 15, that sequences instructions to a datapath. Doing this, a digital signal processing (DSP) algorithm such as equalization can be implemented. Furthermore, this local controller also performs additional instructions, which are invoked by the master interface through pgm and copy.

The data processing block 13 has two modes of operation: an active mode, and a programming mode. The desired mode is set by the master interface through the value of pgm. The data processing block also signal which mode is currently active through a status bit. The data register D (17) is updated when the master interface sets the copy bit and at the same time the data processing block is in programming mode.

A simple protocol controls the programming of the data register D. When a value is available in register I (12), the master interface sends a program mode request to the data processing block by setting the pgm bit. Depending on the real time requirements inside the data processing algorithm, the data processing block will enter the program mode some cycles later and signals this to the master interface through the status bit. The master interface then can update the data register D by setting the copy bit.

The design complexity of the data processing block lies in the simultaneous presence of DSP algorithm and programming protocol. As a consequence, the designer of the data processing block needs to master both a DSP algorithm schedule and a protocol. Whether the FSM is described hierarchically or not does not matter: the designer needs to think of two things at once.

In addition, using current HDL environments, it is not possible to design the DSP processing schedule of the block independently of the protocol, which degrades potential reuse possibilities.

The Object Oriented RT Data Model: the Ones-Counter.

Figure 3:
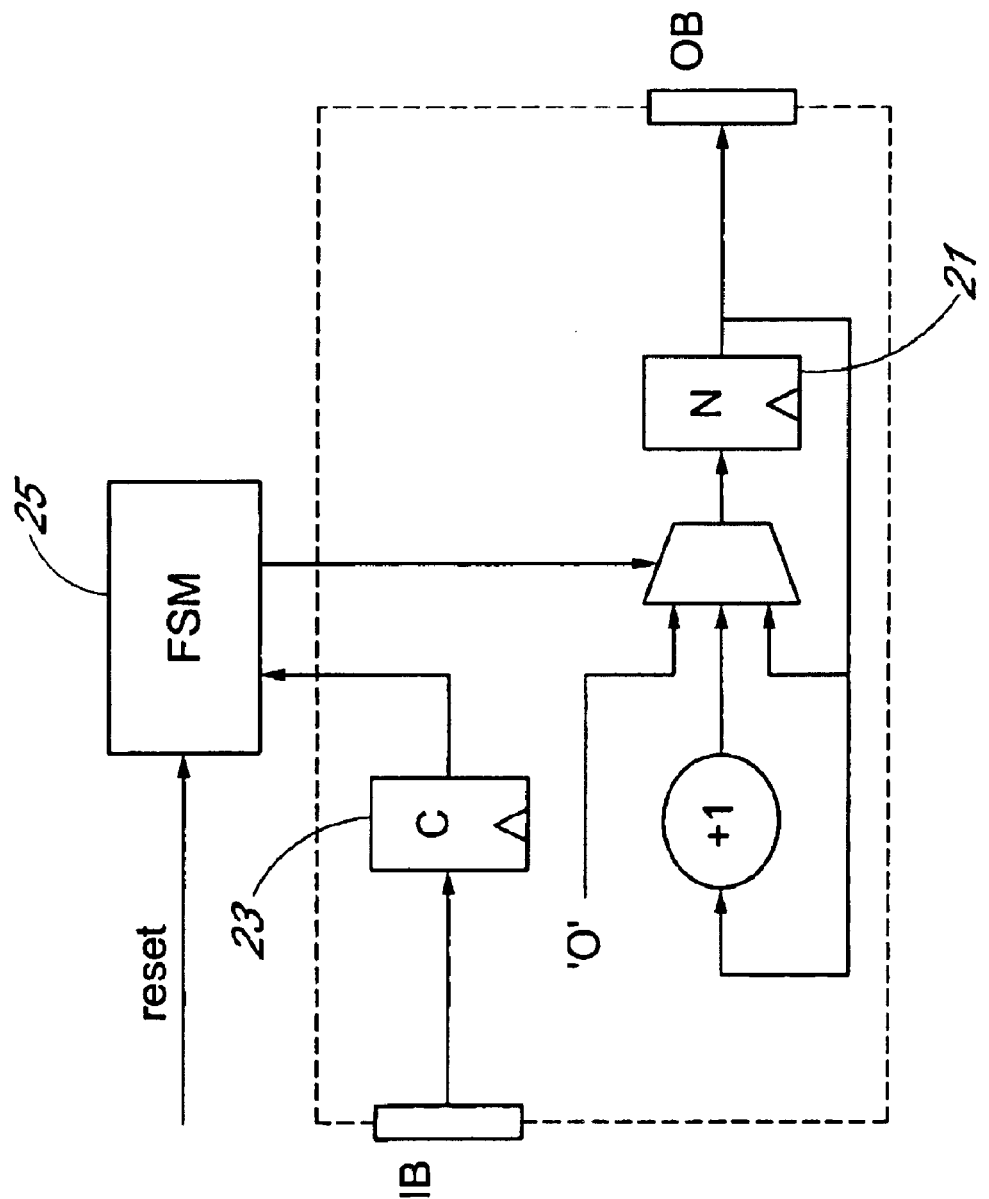
FIG. 3 shows a ones-counter circuit.

Herebelow, the object oriented RT data model is explained in a bottom-up fashion, starting from an architecture and working upwards to an object oriented specification. This will clearly show the relation between the objects and the implementation. An example target architecture is shown in FIG. 3. For the sake of clarity, a simple processor that counts the number of '1' bits in a bit stream, is used. It contains the following elements A datapath with two registers. Register N (21) holds the number of bits seen after the last reset, while register C (23) holds the value of the currently observed bit in the bit stream. It is assumed that the count register N (21) has sufficient width to hold the maximum bit count during two subsequent reset instructions.
 A controller FSM (25) that can increment, hold or reset the count register N (21) in the datapath.

FIG. 4 shows a behavioral RT specification of the same ones-counter. The specification consists of a Mealy-type state transition diagram, and three RT instructions rst, inc and hold. These correspond to the datapath actions in case of reset, observation of '0' and observation of '1' respectively. The behavioral specification contains all the elements that make up the object oriented model. The C++ specification of the same behavior shown below corresponds closely to the representation of FIG. 4. Some comments is included to identify the different elements of the specification.

```
1:   clk ck;            //clk is a class, ck an object of
2:                      //said class
3:   sig C(ck, 0);      //sig is a class,
4:   sig N(ck, 0);      //C and N are objects of class sig
5:   sig input;
6:   sig output;
7:   bus IB;            //bus is a class, IB and OB are objects
8:   bus OB;
9:
10:  sfg rst;
11:  N = 0;
12:  C = input;
13:  rst << in(input, IB);
14:                     //=, <<, + are operation objects
15:  sfg inc;
16:  N = N + 1;
17:  C = input;
18:  output = N;
19:  inc << in(input, IB) << out(output, OB);
20:                     //in is a constructor, it is a class which
                        //creates intermediate/temporary objects
21:  sfg hold;
22:  C = input;
23:  hold << in(input, IB) << out(output, OB);
24:
25:  fsm ones_cnt;      //fsm is a class
26:  state s0;          //state is a class
27:  state s1;
28:  ones_cnt << deflt(s0);  //deflt is a constructor
29:  ones_cnt << s1;
30:  s0 << always << rst << s1;
31:  s1 << cnd(C) << inc << s1;    ////cnd is a constructor
32:  s1 << !cnd(C) << hold << s1;
```

The data processing is expressed in terms of sig classes, that represent plain signals or registers (lines 3–6). Datapath instructions such as rst, inc, and hold are described using the sfg classes. Each of these group a number of signal expressions (lines 10–23). The I/O ports of the behavior are indicated using bus classes. The control description of the ones-counter is captured by a direct modeling of the FSM description in FIG. 4. Each estate of the ones-counter FSM maps into one state class (lines 26–27). The fsm class groups a number of state classes, identifying one as the initial state (lines 28–29). The datapath instructions are assigned to control steps by creating FSM transitions (lines 30–32). A transition contains a source state, a transition condition, a datapath instruction to execute, and a target state. The complete RT behavior of the ones-counter thus is captured as an object hierarchy. The objects are typical behavioral-RT elements such as signals, instructions, and control states. C++ operator overloading is used extensively to construct the object hierarchy. After this C++ description has executed, a reference to the fsm object is sufficient to retrieve the entire processor description as a set of interrelated objects. The reference can be used to simulate the description and generate synthesizable HDL code for it. Both operations are similar to each other and are a specific way of interpreting the object hierarchy stored in memory.

Meta-Code Generation

The design environmetn OCAPI, as disclosed in EP-A-867820, is incorporated herein by reference. The design environment OCAPI is well suited for applying the method according to the present invention.

OCAPI internally can use meta-code generation. With this, it is meant that there are code generators that generate new "fsm", "sfg" and "sig" objects (instances of fsm, sig and sfg classes) which in turn can be translated to synthesizable code.

The use of expandable objects allows to use meta-code generation: creating expandable objects implies an indirect creation of the new objects.

Meta-code generation is a powerful method to increase the abstraction level by which a specification can be made. This way, it is also possible to make parametrized descriptions, possibly using conditions. Therefore, it is the key method of soft-chip components, which are software programs that translate themselves to a wide range of implementations, depending on the user requirements.

The meta-code generation mechanism is also available to one as a user. To demonstrate this, a class will be presented that generates an ASIP datapath decoder.

An ASIP Datapath Idiom

An ASIP datapath, when described as a timed description within OCAPI, will consist of a number of signal flowgraphs and a finite state machine (fsm). The signal flowgraphs express the different functions to be executed by the datapath. The fsm description is a degenerated one, that will use one transition per decoded instruction. The transition condition is expressed by the "instruction" input, and selects the appropriate signal flowgraph for execution.

Because the finite state machine has a fixed, but parametrizable structure, it is subject for meta-code generation. One can construct a "decoder" object, that generates the "fsm" for you. This will allow compact specification of the instruction set. First, the "decoder" object (which is present in OCAPI) itself is presented.

```
-- the include file
#define MAXINS 100
#include "qlib.h"
class decoder : public base
{
    public:
```

```
        decoder(char *__name, clk &ck, dfbfix &__insq);
        void dec(int __numinstr);
        ctlfsm &fsm( );
        void dec(int __code, sfg &);
        void dec(int __code, sfg &, sfg &);
        void dec(int __code, sfg &, sfg &, sfg &);
    private:
        char *name;
        clk *ck;
        dfbfix *insq;
        int inswidth;
        int numinstr;
        int codes[MAXINS];
        ctlfsm _fsm;
        state active;
        sfg decode;
        _sigarray *ir;
        cnd * decend(int );
        void decchk(int );
};
-- the .cxx file
#include "decoder.h"
static int numbits(int w)
{
    int bits = 0;
    while (w)
    {
        bits++;
        w = w >> 1;
    }
    return bits;
}
int bitset(int bitnum, int n)
{
    return (n & (1 << bitnum));
}
decoder::decoder(char *__name, clk &__ck, dfbfix &__insq)
: base(__name)
{
    name = __name;
    insq = __insq.asSource.(this);
    ck = &__ck;
    numinstr = 0;
    inswidth = 0;
    _fsm << __name;
    // active << strapp(name, "__go__");
    active << "go";
    _fsm << deflt(active);
}
void decoder::dec(int n)
{
    // define a decoder that decodes n instructions
    // instruction numbers are 0 to n-1
    // create also the instruction register
    if (! (n>0))
    {
        cerr << "*** ERROR: decoder " << name << " must
            have at least one instruction\n";
        exit(0);
    }
    inswidth = numbits (n-1);
    if (n > MAXINS)
    {
        cerr << "*** ERROR: decoder " << name << "
            exceeds decoding capacity\n";
        exit(0);
    }
    dfix bit(0, 1, 0, dfix::ns);
    ir = new _sigarray((char *) strapp(name, "_ir"),
    inswidth, ck, bit);
    decode.starts( );
    int i;
    SIGW(irw, dfix(0, inswidth, 0, dfix::ns));
    for (i=0; i<inswidth; i++)
    {
        if (i)
            (*ir) [i] = cast(bit, irw >>
            _sig(dfix(i,inswidth,0,dfix::ns)));
        else
```

-continued

```
            (*ir) [i] = cast(bit, irw);
    }
    decode << strapp("decod", name);
    decode << ip(irw, *insq);
}
void decoder::decchk(int n)
{
    // check if the decoder can decode this instruction
    int i;
    if (!inswidth)
    {
        cerr << "*** ERROR: decoder " << name << " must
        first define an instruction width\n";
        exit (0);
    }
    if (n > ((1 << inswidth)-1))
    {
        cerr << "*** ERROR: decoder " << name << "
        cannot decode code " << n << "\n";
        exit(0);
    }
    for (i=0; i<numinstr; i++)
    {
        if (n == codes[i])
        {
            cerr << "*** ERROR: decoder " << name << "
            decodes code " << n << " twice\n";
            exit(0);
        }
    }
    codes[numinstr] = n;
    numinstr++;
}
cnd *decoder::deccnd(int n)
{
    // create the transition condition that corresponds
    // to the instruction number n
    int i;
    cnd *cresult = 0;
    if (bitset(0, n))
        cresult = &__cnd((*ir) [0]);
    else
        cresult = &(!__cnd((*ir) [0]));
    for (i = 1; i < inswidth; i++)
    {
        if (bitset(i, n))
            cresult = &(*cresult && __cnd((*ir) [i]));
        else
            cresult = &(*cresult && !__cnd((*ir) [i]));
    }
    return cresult;
}
void decoder::dec(int n, sfg &s)
{
    // enter an instruction that executes one sfg
    decchk(n);
    active << *deccnd(n) << decode << s << active;
}
void decoder::dec(int n, sfg &s1, sfg &s2)
{
    // enter an instruction that executes two sfgs
    decchk(n);
    active << *deccnd(n) << decode << s1 << s2 <<
    active;
}
void decoder::dec(int n, sfg &s1, sfg &s2, sfg &s3)
{
    // enter an instruction that executes three sfgs
    decchk(n);
    active << *deccnd(n) << decode << s1 << s2 << s3 <<
    active;
}
ctlfsm & decoder::fsm( )
{
    return _fsm;
}
```

The main principles of generation are the following. Each instruction for the ASIP decoder is defined as a number, in addition to one to three signal flowgraphs that need to be executed when this instruction is decoded. The "decoder" object keeps track of the instruction numbers already used and warns one if one introduces a duplicate. If the instruction number is unique, it is split up into a number of instruction bits, and a fsm transition condition is constructed from these bits.

The ASIP Datapath at Work

The use of this object is quite simple. In a timed description were one wants to use the decoder instead of a plain "fsm", one inherits from this decoder object rather then from the "base" class. Next, instead of the fsm description, one gives the instruction list and the required signal flowgraphs to execute.

As an example, an add/subtract ASIP datapath is defined. One selects addition with instruction number 0, and subtraction with instruction number 1. The following code (that also uses the supermacros) shows the specification. The inheritance to "decoder" also establishes the connection to the instruction queue.

```
-- include file
#ifndef ASIP_DP_H
#define ASIP_DP_H
class asip_dp : public decoder
{
public:
    asip_dp (char *name,
        clk &ck,
        FB &ins,
        _PRT(in1),
        _PRT(in2),
        _PRT(o1));
private:
    PRT(in1);
    PRT(in2);
    PRT(o1 );
};
-- code file
#include "asip_dp.h"
dfix typ(0, 8, 0);
asipdp::asip_dp    (char *name,
        clk &ck,
        FB &ins,
        _PRT(in1),
        _PRT(in2),
        _PRT(o1)):   decoder(name, ck, ins),
            IS_SIG(in1, typ),
            IS_SIG(in2, typ),
            IS_SIG(o1, typ)
{
IS_IP(in1);
IS_IP(in2)
IS_OP(o1);
SFG(add);
GET(in1);
GET(in2);
o1 = in1 + in2;
PUT(o1);
SFG(sub);
GET(in1);
GET(in2);
o1 = in1 – in2;
PUT(o1);
dec(2); // decode two instructions
dec(0, SFGID(add));
dec(1, SFGID(sub));
}
```

To conclude, one can see that meta-code generation allows reuse of design "idioms" rather then design "instances". Intellectual-property code generators are a direct consequence of this.

Having a design description stored as an object hierarchy in memory creates the possibility of manipulating it. These manipulations can for instance create new state objects, define extra instructions with signal objects, etc. Some examples where this can be useful are:

Attaching extra wait states or transitions to an fsm in order to add a synchronization capability.

Adding extra operations to an instruction to produce enhanced capabilities, such as for instance overflow detection in the ones-counter example.

Merging of different functional descriptions into one description that can then be jointly optimized in a synthesis tool.

Creation of new reuse classes, that are constructed using existing ones. This corresponds to the well known abstraction mechanism of C++, and is the key to the reuse method of the invention.

FIG. 8 shows a summary of the present invention: a hardware design 53 is made using class library 51, resulting in objects 55 that describe an implementable description of the design. The objects 55 are grouped in new classes 57, which can be integrated is the class library to form an extended class library 59. The new classes can then be used for the design of new hardware. The second design 61 can be made using objects' 63, resulting in an implementable description' and second hardware'.

Behavioral reuse is applied by a two-step process. First, the reuse problem is formulated as a (possibly parametric) expansion of RT-behavior. This is done in terms of manipulations on the OO-RT model (adding/modifying of states, transitions, signals, or instructions). As a second step, the manipulation is captured in an class that can be reused. Such a class contains an expand( ) method (a parametric expansion of the object), which manipulates existing OO-RT behavior. The arguments of expand( ) are called the hooks of the behavioral reuse object. The hooks indicate the starting point for the manipulations on the OO-RT model. A small example makes the concept of expand( ) method and hook clear. Consider adding a new state to an fsm. This can be described in a behavioral reuse class as:

```
1:  class addstate {
2:      public:
3:          addstate( );
4:          expand(fsm &f) {
5:              state *s0 = new state;
6:              f << *so;
7:          }
8:  };
```

The reuse class addstate has one hook: a reference to the fsm which receives the new state. The expand( ) method of addstate appends this state to the fsm.

EXAMPLE 1

Interblock Synchronization as an Application of Behavioral RT Reuse According to the Invention The interblock synchronization is solved as an application of behavioral reuse. FIG. 5 shows a part from example 1 as an input for reuse. We explain the synchronization solution for the case of the PUT instruction done by processor P1 (1). This processor is connected to the processor P2 (2) via a communication bus object (3). The immediate implementation of such a bus object is simple wiring. In case however the PUT (4) has to be synchronized to the corresponding GET in processor P2, a synchronizer object (5) comes into play. The synchronizer object 5 will take care of merging a synchronization protocol into P1's OO-RT description. In P2's OO-RT description, a similar synchronizer object is used to provide a matching protocol. Being a reuse class, the synchronizer needs hooks (6) and an expand method (7). The hooks for this reuse class are a communication bus on one hand, and an FSM that reads/writes this communication bus on the other. Given the fsm of P1 and the bus object that carries the PUT, the expand( ) method of the synchronizer modifies the OO-RT description of P1 as shown on the bottom of the figure. Several modifications take place during the expansion. First, a wait transition is inserted. In addition, new instructions are added, which provide the signaling of a synchronous handshake protocol (S. Vercauteren and Bill Lin. Hardware/software Communication and System Integration for Embedded Architectures. Design Automation of Embedded Systems, Kluwer Academic Publishers, 2: 1–24, 1997). The signaling is done through newly created bus objects p_req (8) and p_ack (9). The inserted instructions include: req1 and req0, which assert/deassert the request for data communication, and read, which samples the acknowledge bus. The sampled value is used as a transition condition in the expanded FSM. The protocol implementation of GET (as for instance in processor P2) proceeds by a similar, symmetrical expansion. The parametric expansion algorithm, done by the reuse class synchronizer can be as follows:

```
0:  ***definitions:
1:  -   for any transition in a finite state machine
2:      running from state 'A' to state 'B',
3:      call 'A' a source state of this transition
4:      call 'B' a target state of this transition
5:  -   for any transition in a finite state machine
6:      with source state 'A' and target state 'B',
7:      call 'pred(transition)' any transition for
8:      which 'A' is a target state
9:  *** algorithm
10: for each synchronized I/O access transition {
11:     add new wait transition on the source state
12:     update transition conditions from the source state
13: }
14: for each synchronized I/O access transition {
15:     insert instruction req1 on all pred(transition)
16:     insert instruction req0 on all !pred(transition)
17: }
18: for each transition
19:     insert instruction read
```

The algorithm shown has still certain limitations. For example, two I/O accesses subject to synchronization in the same transition are not allowed. However, by formulating the synchronization problem as a behavioral reuse problem, the synchronizer object can be readily replaced by a new, more sophisticated one without additional modifications to the original behavior of P1.

EXAMPLE 2

The Programming Interface as a Behavioral Reuse Object According to the Present Invention The programming interface problem is another natural candidate for reuse at behavioral level. FIG. 6 shows the decomposition of the data processing block (31). The designer is responsible for the description of the data processing (33) itself, but does not need to worry about the protocol with the master interface. Rather, this protocol is available through an class prog_itf (35). To implement the programming interface in the data processing block, a number of hooks must be given to the programming interface.

These include: a reference to the data register for implementing a write operation from the master interface and a reference to a state at which the block can go into programming mode. Given these hooks, the expand method of prog_itf can be called to implement the programming interface into the block. An example of the operation of prog_itf is shown in FIG. 7. Data register D (41), as well as state S2 (43) of the original FSM where hooked (45) onto the programming interface object (35). Calling the expand( ) method (47) of prog_itf modifies the original state transition diagram resulting in one as shown on the bottom of the figure. One new state is inserted, as well as four new transitions. In addition, four new instructions are inserted, needed for writing into the D register (upd), signaling the block status (status0, status1), and reading the master interface commands read. This last instruction also requires the creation of two new condition registers (prog and copy) to hold these commands. It is seen that the programming interface is an ideal candidate for reuse, since it is independent of the behavior in which it is embedded. It also allows very compact descriptions. In a 80 Kgate cable modem, a similar class can be used for the construction of an I2C programming interface. The interface class was applied to 6 different data processors in the modem. The complete description of the modem in C++ at the OO-RT level took 4426 lines of code, while the RT-VHDL, generated out of this code, took 21798 lines. The gain in code size was for a large part credited to the behavioral reuse mechanism of the programming interface.

EXAMPLE 3

Comparison of Two 80-Kilogate Designs Designed With and Without Reuse According to the Present Invention The method according to the present invention was applied on two 80-kilogate designs: an upstream Cable Modem and a DECT base station transceiver. For both designs, the first line indicates the C++ line count in the OO-RT model. The RT-VHDL line count of generated code is shown on the second line. The type of code is divided into reuse (reusable classes such as programming interfaces obtained according to the present invention), body (line count of individual block bodies), headers (.h files for C++ and entity declarations for VHDL) and system (the system level netlist and testbench drivers).

TABLE 2

RT line counts for 2 example designs

| | Line count | | | | |
|---|---|---|---|---|---|
| | Reuse | Body | Headers | System | Total |
| Cable OO RT-C++ | 1746 | 5369 | 1975 | 4023 | 13113 |
| Cable RT-VHDL | | 21798 | 5654 | 2180 | 29631 |
| DECT OO RT-C++ | 800 | 8776 | 2286 | 1192 | 13054 |
| DECT RT-VHDL | | 19781 | 6271 | 2311 | 28363 |

The savings in coding are obvious considering the total line count. In VHDL, the reused classes get instantiated in the body of blocks, which are increased considerably.

What is claimed is:

1. A method for designing an electronic system comprising at least one digital part, the method comprising:
representing a behavioral description of said system as a first set of objects with a first set of relations therebetween;
refining said behavioral description into an implementable description of said system, said implementable description being represented as a second set of objects with a second set of relations therebetween; and
retaining at least one of said second objects for reuse in the design of a second electronic system.

2. A method for designing an electronic system comprising at least one digital part, the method comprising:
representing a behavioral description of said system as a first set of objects with a first set of relations therebetween;
refining said behavioral description into an implemeritable description of said system, said implementable description being represented as a second set of objects with a second set of relations therebetween; and
retaining at least one of said second objects for reuse in the design of a second electronic system,
wherein retaining at least one of said second objects additionally comprises:
selecting out of said second set of objects a subset of second objects having substantially the same functionality and/or characteristics in said implementable description;
creating a class representing said same functionality and/or characteristics; and
storing said class in a library.

3. The method of claim 2, wherein said second electronic system comprises objects that are instances of said class.

4. The method of claim 2, wherein said second set of objects have a common semantics.

5. The method of claim 2, wherein said class comprises a function.

6. The method of claim 2, wherein said class executes a parametric manipulation on said second set of objects.

7. The method of claim 6, wherein said parametric manipulation is a parametric expansion.

8. The method of claim 7, wherein said parametric expansion includes the addition of functions to an object for creating a new object.

9. The method of claim 2, wherein said class is a reusable component.

10. The method of claim 9, additionally comprising:
describing the electronic system by formal means in a formal description, said formal description being the representation of said behavioral description of said system as said second set of objects with said second set of relations therebetween;
selecting a functional entity within said system, said functional entity corresponding to said subset of second objects having substantially the same functionality and/or characteristics in said implementable description;
formulating said functional entity as a reusable entity by formulating said functional entity as a parametric expansion of said formal description; and
describing said reusable entity as said reusable component using said formal description such that said reusable entity is a parametric expansion of said reusable component.

11. The method according to claim 10, wherein said formal description is formulated in an object-oriented programming language, and said parametric expansion is performed on an object hierarchy.

12. The method of claim 2, additionally comprising designing another electronic system comprising at least one digital part, wherein said class is used for creating objects within the design of the other electronic system.

13. The method of claim 12, additionally comprising:
selecting the behavioral register-transfer level design description of a first hardware component within the design of said electronic system, said hardware component having at least a part of the desired functionality of a target hardware component that is comprised in the design of said other electronic system;
determining the changes that are necessary to reuse said hardware component in the design of said other electronic system; and
formulating the changes that are necessary to reuse said hardware component in a class that is able to transform the implementable description of said hardware component into said target hardware component.

14. The method of claim 13, wherein said changes comprise a parametric expansion performed on an object hierarchy.

15. The method of claim 14, wherein said object hierarchy is expressed using an object-oriented programming language.

16. The method of claim 15, wherein the object-oriented programming language is C++.

17. The method of claim 13, wherein said behavioral description is described as a hierarchy of one or more objects selected from the group consisting of:
finite state objects,
state objects enumerating the states of said finite state objects,
transition objects that relate said state objects,
instruction objects that represent processing done when said transition objects are executed, and
operation objects that make up parts of said instruction objects.

18. The method of claim 17, wherein the changes are selected from the group consisting of:
adding extra state objects and/or transition objects to a finite state machine,
adding extra operations to instruction objects,
merging two or more behavioral descriptions,
removing an object from said hierarchy,
modifying an object from said hierarchy, and
any combination of the above.

19. The method of claim 13, wherein the behavioral register-transfer level design of the first hardware component is expressed using an object-oriented programming language.

20. The method of claim 19, wherein said object-oriented programming language is C++.

21. The method of claim 13, additionally comprising formulating structural characteristics of a hardware component as an object hierarchy of one or more objects selected from the group consisting of:
finite state objects,
state objects enumerating the states of said finite state objects,
transition objects that relate said state objects,
instruction objects that represent processing done when said transition objects are executed, and
operating objects that make up parts of said instruction objects.

22. The method of claim 21, wherein said formulating comprises the addition of new objects, permitting interaction with existing objects, and adjustments to said existing objects allowing said interaction.

23. The method of claim 21, wherein said formulating is performed in an extendible environment and comprises expansion of existing objects.

24. A method for the reuse of a first hardware component in a hardware design, comprising:
selecting the behavioral register-transfer level design description of a first hardware component with at least a part of the desired functionality of a target hardware component that is comprised in said hardware design,
if necessary, transforming said design description to an object hierarchy,
determining the changes that are necessary to reuse said hardware component in said hardware design, and
creating an object that comprises a method capable of transforming said object hierarchy into a second object hierarchy that describes said target hardware component.

25. The method of claim 24, wherein said object hierarchy is expressed using an object-oriented programming language.

26. The method of claim 25, wherein the object-oriented programming language is C++.

27. The method of claim 24, wherein the behavioral register-transfer level design of the first hardware component is expressed using an object-oriented programming language.

28. The method of claim 27, wherein said object-oriented programming language is C++.

29. A method for the reuse of a first hardware component in a hardware design, comprising:
selecting the behavioral register-transfer level design description of a first hardware component with at least a part of the desired functionality of a target hardware component that is comprised in said hardware design,
if necessary, transforming said design description to an object hierarchy,
determining the changes that are necessary to reuse said hardware component in said hardware design, and
creating an object that comprises a method capable of transforming said object hierarchy into a second object hierarchy that describes said target hardware component,
wherein the changes are selected from the group consisting of:
adding extra states or transitions to a finite state machine,
adding extra operations to an instruction to provide extra functionality,
merging two or more descriptions,
modifying states, transitions, signals and/or instructions, and
any combination of the above.

30. A method for the reuse of a first hardware component in a hardware design, comprising:
selecting the behavioral register-transfer level design description of a first hardware component with at least a part of the desired functionality of a target hardware component that is comprised in said hardware design,
if necessary, transforming said design description to an object hierarchy,
determining the changes that are necessary to reuse said hardware component in said hardware design, and
creating an object that comprises a method capable of transforming said object hierarchy into a second object hierarchy that describes said target hardware component, wherein the behavioral register-transfer level design of the first hardware component is expressed using an object-oriented programming language, wherein said object-oriented programming language is C++, and wherein the reuse of a part of a hardware design comprises:

describing said hardware design by formal means in a formal description, selecting said part of said hardware design, formulating said part as a reusable part by formulating said part as a parametric expansion of said formal description, and describing a reusable prototype of said reusable part using said formal description such that said reusable part is a parametric expansion of said reusable prototype.

31. The method of claim 30, wherein said formal description is an object-oriented programming language and said parametric expansion is performed on an object hierarchy.

* * * * *

UNITED STATES PATENT AND TRADEMARK OFFICE
CERTIFICATE OF CORRECTION

PATENT NO. : 7,113,901 B1
APPLICATION NO. : 09/273089
DATED : September 26, 2006
INVENTOR(S) : Schaumont et al.

It is certified that error appears in the above-identified patent and that said Letters Patent is hereby corrected as shown below:

Title Page, Item [56] References Cited
Page 1, Column 1, line 3, after "5,623,418 A 4/1997" delete "Rosotker" and insert -- Rostoker --.

Page 2, Column 1, line 2, delete "IEE" and insert -- IEEE --.

Page 2, Column 1, line 3, after "144" insert -- , --.

Page 2, Column 2, line 17, delete "Co-Ware" and insert -- CoWare --.

Page 2, Column 2, line 32, delete "In" and insert -- in --.

Page 2, Column 2, line 39, delete "Design&" and insert -- Design & --.

Column 1, line 2, after "RELATED" delete "APPLICATION" and insert -- APPLICATIONS --.

Column 1, line 5 (approx.) after "09/237,549" insert -- , --.

Column 1, line 7 (approx.) after "reference" insert -- , --.

Column 3, line 8, after "of" and insert -- : --.

Column 3, line 19 (approx.) after "of" and insert -- : --.

Column 4, line 50, delete "preffered" and insert -- preferred --.

Column 7, line 15, delete "IO" and insert - I/O --.

Column 8, line 13, after "elements" insert -- : --.

Column 9, line 3, delete "estate" and insert -- state --.

Column 9, line 22, delete "environmetn" and insert -- environment --.

Column 10, line 36, delete "insq = _insq.asSource.(this);" and insert -- insq = _insq.asSource(this); --.

Column 12, line 39, delete "asipdp::asip_dp" and insert -- asip_dp::asip_dp --.

Column 12, line 48, after "IS_IP(in2)" insert -- ; --.

Column 13, line 31 (approx.) delete "an" and insert -- a --:

UNITED STATES PATENT AND TRADEMARK OFFICE
CERTIFICATE OF CORRECTION

PATENT NO. : 7,113,901 B1
APPLICATION NO. : 09/273089
DATED : September 26, 2006
INVENTOR(S) : Schaumont et al.

It is certified that error appears in the above-identified patent and that said Letters Patent is hereby corrected as shown below:

Column 14, line 65, delete "an" and insert -- a --.

Column 16, line 12-13, in claim 2, delete "implemeritable" and insert -- implementable --.

Signed and Sealed this

Sixth Day of March, 2007

JON W. DUDAS
*Director of the United States Patent and Trademark Office*